United States Patent
Kura et al.

(10) Patent No.: US 11,499,811 B2
(45) Date of Patent: Nov. 15, 2022

(54) TAPE FEEDER

(71) Applicant: FUJI CORPORATION, Chiryu (JP)

(72) Inventors: Kazuaki Kura, Handa (JP); Akira Hara, Toyohashi (JP); Yuichi Shimamoto, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 336 days.

(21) Appl. No.: 16/649,338

(22) PCT Filed: Sep. 25, 2017

(86) PCT No.: PCT/JP2017/034577
§ 371 (c)(1),
(2) Date: Mar. 20, 2020

(87) PCT Pub. No.: WO2019/058561
PCT Pub. Date: Mar. 28, 2019

(65) Prior Publication Data
US 2020/0217639 A1 Jul. 9, 2020

(51) Int. Cl.
*G01R 31/28* (2006.01)
*G01R 33/02* (2006.01)
*G01R 33/07* (2006.01)
*G01B 7/14* (2006.01)
*G01B 7/30* (2006.01)
(Continued)

(52) U.S. Cl.
CPC ........... *G01B 7/30* (2013.01); *G01R 33/0094* (2013.01); *H05K 13/022* (2013.01); *H05K 13/0419* (2018.08)

(58) Field of Classification Search
CPC ........ G01R 31/28; G01R 33/02; G01R 33/07; G01B 7/14; G01B 7/30; H05K 13/02; H05K 13/04; H05K 13/08
See application file for complete search history.

(56) References Cited

U.S. PATENT DOCUMENTS

2011/0298448 A1* 12/2011 Foletto ............... G01D 5/14
324/207.13
2018/0376629 A1* 12/2018 Tanaka ............... G01D 5/145

FOREIGN PATENT DOCUMENTS

| JP | 2002-257590 A | 9/2002 |
| JP | 2007-73632 A | 3/2007 |
| JP | 2017-11316 A | 1/2017 |

OTHER PUBLICATIONS

International Search Report dated Dec. 5, 2017 in PCT/JP2017/034577 filed Sep. 25, 2017, citing documents AP and AQ therein, 1 page.

* cited by examiner

Primary Examiner — Neel D Shah
(74) Attorney, Agent, or Firm — Oblon, McClelland, Maier & Neustadt, L.L.P.

(57) ABSTRACT

An angle sensor of a tape feeder includes a magnetic body that rotates in conjunction with the rotation of a sprocket, a magnetic sensor that outputs a detection signal corresponding to the angle of the magnetic body with respect to the feeder main body, and an angle calculating section that performs offset processing for adjusting an origin of the detection signal using a preset offset value, gain processing that adjusts the magnitude of the detection signal using a preset gain value, and that calculates the angle of the magnetic body based on the adjusted detection signal. The (Continued)

control device performs correction processing for correcting at least one of the offset value or the gain value based on the detected signals outputted from the magnetic sensor.

10 Claims, 3 Drawing Sheets

(51) Int. Cl.
    *H05K 13/04*     (2006.01)
    *G01R 33/00*     (2006.01)
    *H05K 13/02*     (2006.01)

| | Detection signal | | | | Correction value | |
|---|---|---|---|---|---|---|
| | Average value | Maximum value | Minimum value | Amplitude | Offset value | Gain value |
| Magnetic sensor (X) | Av1 | Max1 | Min1 | P1 | 0 | 1 |
| Magnetic sensor (Y) | Av2 | Max2 | Min2 | P2 | $\Delta S$ (=Av1−Av2) | P2/P1 |

TAPE FEEDER

TECHNICAL FIELD

The present disclosure relates to a tape feeder.

BACKGROUND ART

A tape feeder is used for a mounting process by an electronic component mounting machine, as disclosed in, for example, patent literature 1. The tape feeder conveys carrier tape containing electronic components by rotating a sprocket that engages the carrier tape to provide an electronic component to the electronic component mounting machine at a supply section. The tape feeder may be controlled based on the angle of the sprocket detected by an angle sensor, for example, in order to position the electronic component at the supply section with high accuracy.

CITATION LIST

Patent Literature

Patent Literature 1: JP-A-2017-011316

SUMMARY OF INVENTION

Technical Problem

In the tape feeder as described above, the rotation of the sprocket needs to be controlled more accurately in order to improve the positioning accuracy of the electronic component. Further, if the sensitivity of the angle sensor changes, an error may occur in the angle of the detected sprocket, which may affect the positioning accuracy of the electronic component. Further, maintenance of the tape feeder including the angular sensor takes a predetermined time, which may affect the productivity.

It is an object of the present disclosure to provide a tape feeder capable of more accurately controlling rotation of a sprocket.

Solution to Problem

Disclosed herein is a tape feeder for conveying carrier tape containing electronic components to supply the electronic components to an electronic component mounting machine, the tape feeder including: a feeder main body; a sprocket rotatably provided on the feeder main body and arranged with multiple engagement protrusions configured to engage with multiple engagement holes formed on the carrier tape; a magnetic body configured to rotate in conjunction with rotation of the sprocket; a magnetic sensor configured to output a detection signal corresponding to an angle of the magnetic body with respect to the feeder main body; an angle calculating section configured to perform offset processing for adjusting an origin of the detection signal using a preset offset value, gain processing for adjusting a magnitude of the detection signal using a preset gain value, and calculation of an angle of the magnetic body based on the adjusted detection signal; and a control device configured to control rotation of the sprocket based on an angle of the magnet body calculated by the angle calculating section.

Advantageous Effects

According to such a configuration, the control device performs offset processing and gain processing on the detection signals of the magnetic sensor to adjust the detected signals. As a result, in the tape feeder, the angle of the sprocket can be detected in consideration of individual differences of the angle sensor including the magnetic sensor, the mounting error, and the like. Therefore, the angle of the sprocket can be controlled more accurately by using the adjusted detection signals.

DESCRIPTION OF EMBODIMENTS

1. Embodiments

1-1. Overview of Electronic Component Mounting Machine 10

Figure 1:
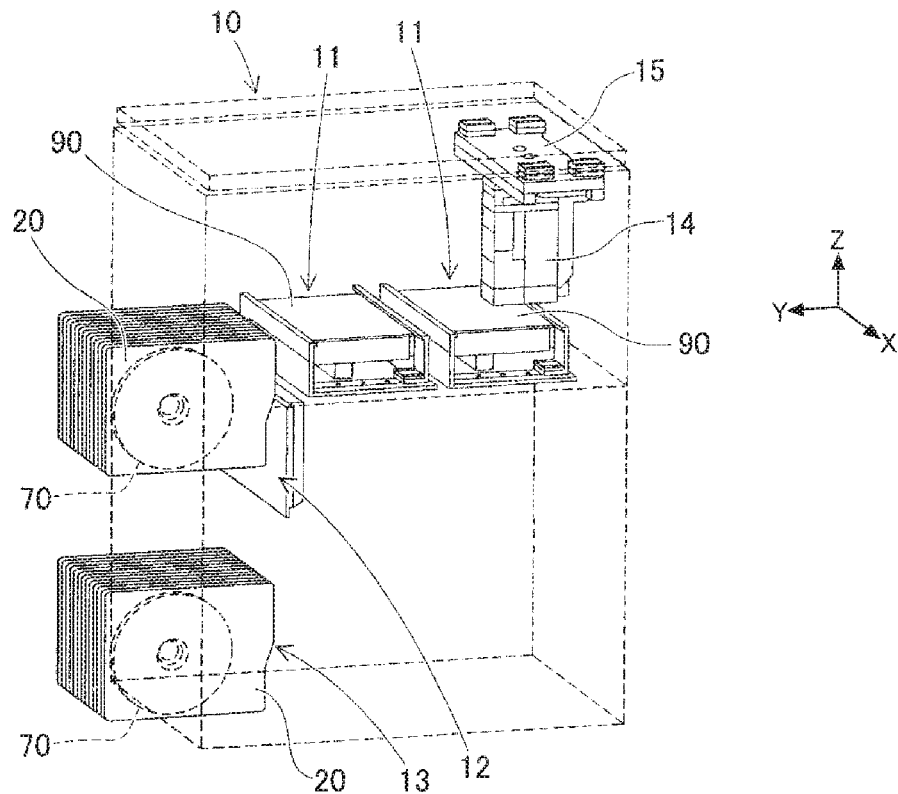
FIG. 1 is a perspective view showing an overview of the configuration of an electronic component mounting machine.

Electronic component mounting machine 10 uses tape feeder 20 to mount electronic components on circuit board 90. Hereinafter, the electronic component mounting machine is referred to as "component mounter", the tape feeder is referred to as "feeder", the circuit board is referred to as "board", and the electronic component is referred to as "component". As shown in FIG. 1, component mounting machine 10 includes board conveyance device 11, upper section slots 12, lower section slots 11, mounting head 14, and head moving device 15. Board conveyance device 11 loads board 90 inside component mounting machine 10, and positions the board 90 at a predetermined position. Then, after mounting processing has been performed by component mounting machine 10, board conveyance device 11 unloads circuit board 90 from component mounting machine 10.

Upper section slots 12 are arranged on an upper section on the front side of component mounting machine 10. Upper section slots 12 hold feeders 20 in a manner such that operation is possible. Operation of feeders 20 set in upper section slots 12 during mounting processing is controlled by component mounting machine 10, such that components are supplied to supply section 211 provided at a specified position on an upper section of feeders 20 (refer to FIG. 2). Lower section slots 13 are provided below upper section slots 12. Lower section slots 13 store feeders 20 to be used in mounting processing by component mounting machine 10 or used feeders 20 that have been used in mounting processing. Note that, exchange of feeders 20 between upper section slots 12 and lower section slots 13 is performed automatically by an exchange robot (not shown), or manually by an operator.

Mounting head 14 is provided with a suction nozzle (not shown) that picks up a component supplied by feeder 20. The suction nozzle is supplied with negative pressure air to pick up the component. Instead of a suction nozzle, mounting head 14 may be provided with a chuck or the like for gripping a component in order to pick up and hold it. Mounting head 14 holds the suction nozzle so as to be vertically movable and rotatable about a vertical axis. Head moving device 15 moves mounting head 14 in a horizontal direction via, for example, a linear drive mechanism.

Component mounting machine 10 configured as described above appropriately controls operation of mounting head 14, head moving device 15, and feeders 20 during mounting processing. As a result, component mounting machine 10 picks up components supplied by feeders 20, and mounts the components at predetermined positions of board 90 to produce various board products.

1-2. Configuration of feeder 20

Figure 2:
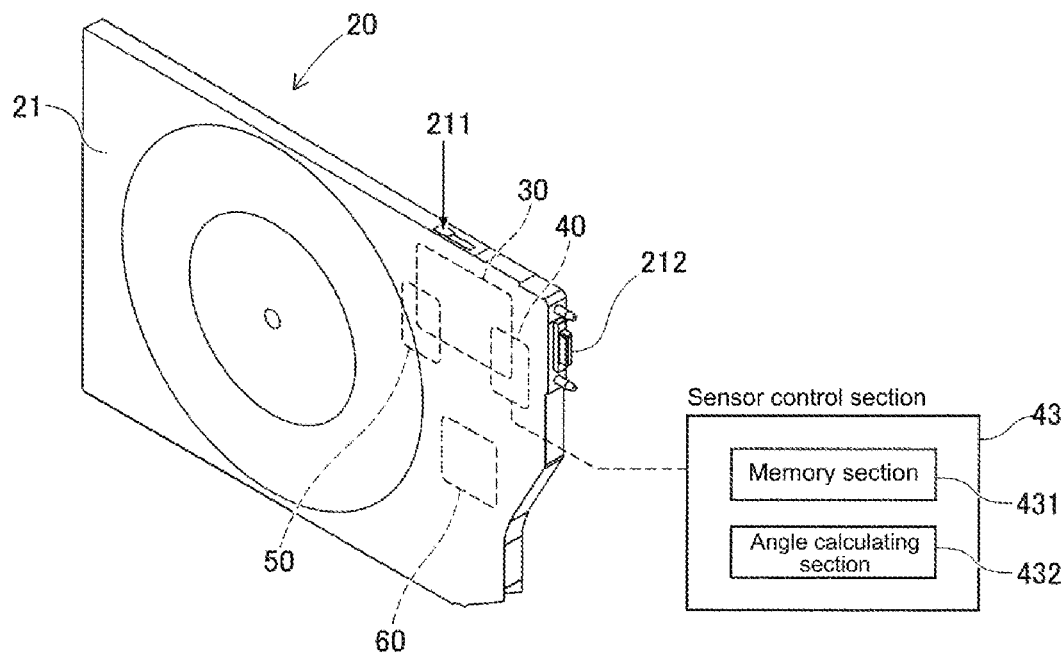
FIG. 2 is a perspective view of a tape feeder.

The configuration of feeder 20 will be described with reference to FIGS. 2 to 6. Feeder 20 includes feeder main body 21, driving device 30, angle sensor 40, detection sensor 50, and control device 60. As shown in FIG. 2, feeder main body 21 is formed in a flat box shape. Feeder main body 21 has supply section 211 for supplying components to component mounting machine 10. Supply section 211 is formed on an upper section on the front side of feeder main body 21 (lower right side in FIG. 2).

Figure 3:
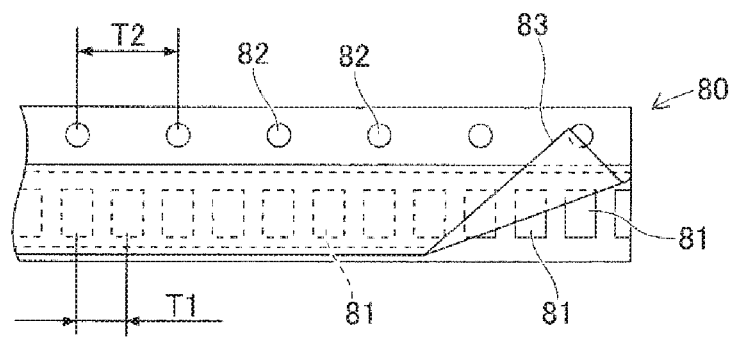
FIG. 3 is a plan view showing a portion of carrier tape.

In addition, feeder main body 21 detachably (exchangeably) holds tape reel 70 on which carrier tape 80 is wound. Tape reel 70 is rotatably supported with respect to feeder main body 21. As shown in FIG. 3, carrier tape 80 has multiple cavities 81 for accommodating components, and multiple engagement holes 82 formed at predetermined intervals in the conveyance direction (longitudinal direction of the carrier tape).

Cover tape 83 is bonded to the upper surface of carrier tape 80 such that the opening section of cavities 81 is closed. Cover tape 83 is peeled from a portion of carrier tape 80 conveyed to supply section 211 such that mounting head 14 can pick up a component. In other words, by positioning one of the multiple cavities 81 in carrier tape 80 at supply section 211, the feeder 20 supplies the component housed in the cavity 81 such that pickup is possible. Hereinafter, carrier tape is referred to as "tape".

Here, multiple cavities 81 are formed at predetermined intervals in the conveyance direction, similar to the multiple engagement holes 82. Interval T1 of cavities 81 is set appropriately according to the dimensions of the components being housed. For example, as shown in FIG. 3, interval T1 of cavities 81 is set to half the interval T2 of engagement holes 82 (T1=T2/2). Further, interval T1 of cavities 81 may be set to an integer multiple of spacing T2 of engagement holes 82 (T1=N·T2, N being an integer greater than or equal to 1).

Figure 4:
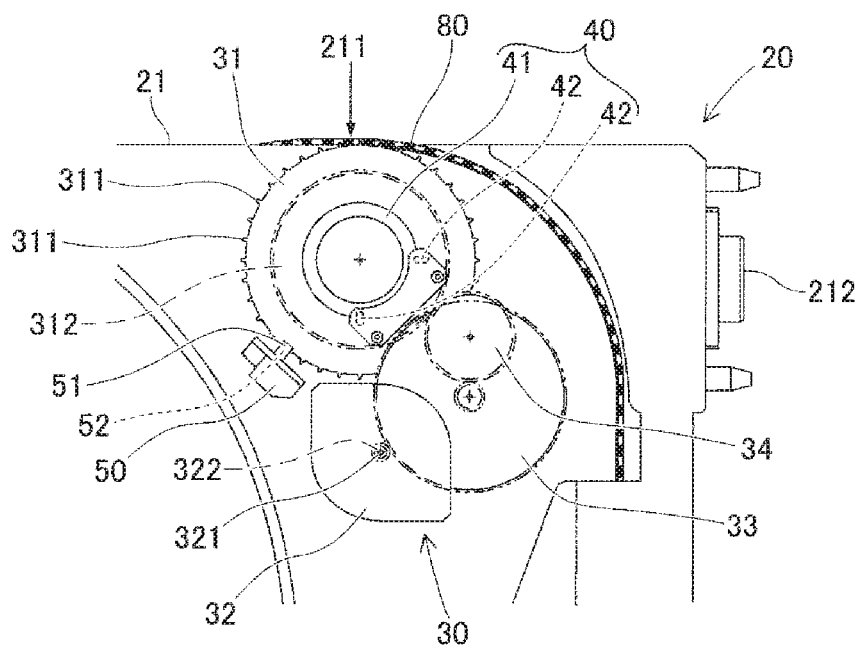
FIG. 4 is a side view schematically showing the configuration of the tape feeder.

As shown in FIG. 4, driving device 30 has sprocket 31 rotatably supported by feeder main body 21. Sprocket 31 has engagement protrusions 311 that can engage with engagement holes 82 of tape 80 arranged at equal intervals in a circumferential direction. Driving device 30 has stepping motor 32 as a drive source for turning sprocket 31. Stepping motor 32 rotates sprocket 31 in accordance with supplied pulse power.

Specifically, when rotation shaft 321 of stepping motor 32 rotates, reduction gear 33 engaging with driving gear 322 provided on rotation shaft 321 rotates. The driving force outputted by stepping motor 32 is transmitted to sprocket 31 via intermediate gear 34 engaging with reduction gear 33. Intermediate gear 34 engages with sprocket gear 312 provided on sprocket 31. As a result, sprocket 31 rotates as intermediate gear 34 rotates.

Angle sensor 40 detects the angle of sprocket 31 with respect to feeder main body 21. In the present embodiment, angle sensor 40 includes magnetic body 41, a pair of magnetic sensors 42, and sensor control section 43. Magnetic body 41 is provided so as to rotate in conjunction with the rotation of sprocket 31. In the present embodiment, magnetic body 41 is formed in a cylindrical shape, and is provided coaxially with sprocket 31 so as to rotate integrally with sprocket 31. Magnetic body 41 is magnetized so as to be radially bipolar.

Figure 5:
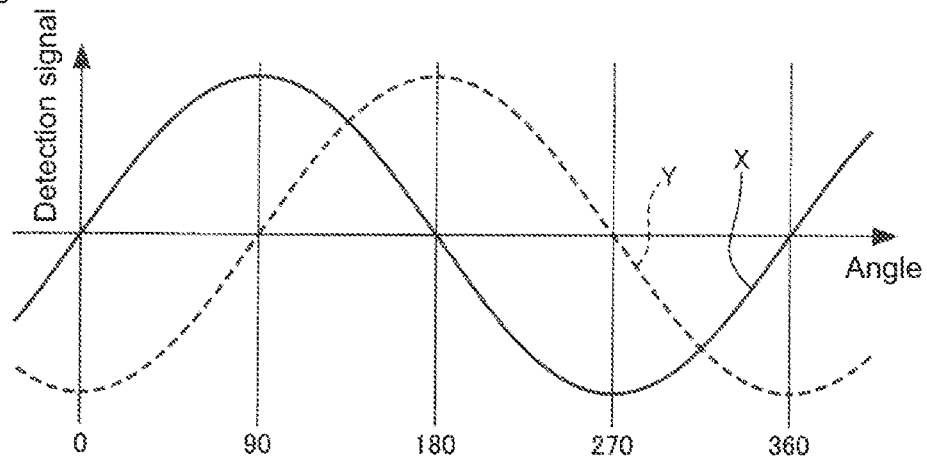
FIG. 5 is a graph showing a relationship between detection signals of an angle sensor and a sprocket angle.

Each of the pair of magnetic sensors 42 outputs a detection signal corresponding to the angle of magnetic body 41 with respect to feeder main body 21. Specifically, the magnitude and direction of the magnetic field generated by magnetic body 41 are detected, and sinusoidal detection signals are outputted. The "sinusoidal detection signal" is a periodic signal that can be approximated to a sinusoidal wave as a whole, and includes a signal that becomes a rectangular wave depending on the resolution. The pair of magnetic sensors 42 are arranged at specified angles (90 degrees in this embodiment) apart from each other along the rotational direction of magnetic body 41. As a result, the detected signals outputted from the pair of magnetic sensors 42 are shifted in phase by 90 degrees as shown in FIG. 5.

Sensor control section 43 controls operation of angle sensor 40 in accordance with an instruction from control device 60 of feeder 20. Sensor control section 43 outputs the detected angle of sprocket 31. As shown in FIG. 2, sensor control section 43 includes memory section 431 and angle calculating section 432. Memory section 431 is configured by a flash memory or the like. The memory section 431 stores various programs and calibration values used for controlling angle sensor 40.

Figures 6, 7:
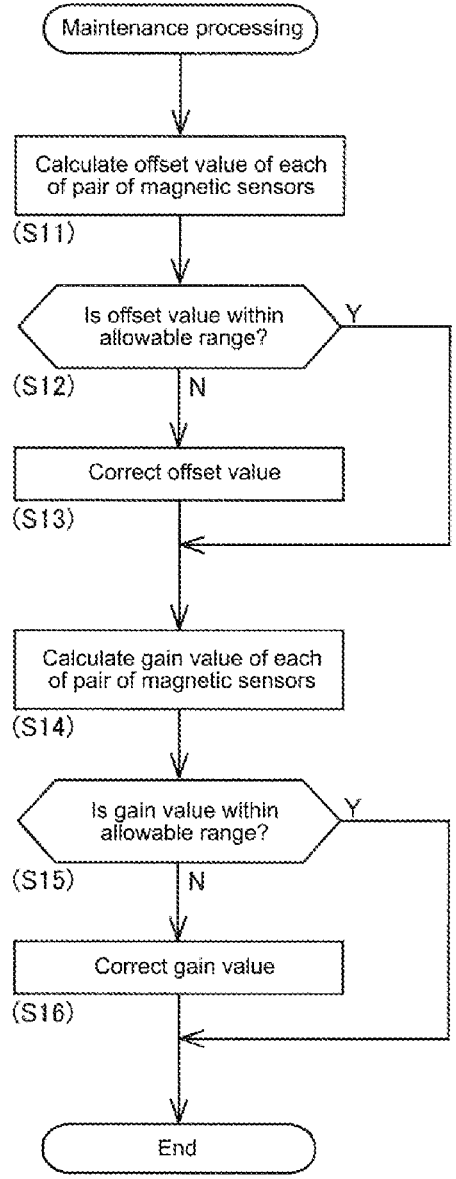
FIG. 6 shows detection signal values, offset values, and gain values.
FIG. 7 is a flowchart showing maintenance processing of the angle sensor.

A calibration value is a value set for each of specified angles of sprocket 31, and includes a correction value of the pulse power supplied to stepping motor 32. A correction value of the pulse power is a value for correcting the variation of the operation amount of driving device 30 in order to rotate sprocket 31 by a specified rotation amount. In addition, as shown in FIG. 6, the above-mentioned calibration values include values set for each of the pair of magnetic sensors 42, and offset values and gain values used when angle calculating section 432 calculates the angle of magnetic body 41.

Angle calculating section 432 performs offset processing and gain processing on the detection signals respectively outputted from the pair of magnetic sensors 42, and calculates the angle of magnetic body 41 based on the respective detection signals adjusted by the offset processing and the gain processing. In the present embodiment, since magnetic body 41 is provided integrally with sprocket 31, angle sensor 40 outputs the angle of magnetic body 41 with respect to feeder main body 21 as the angle of sprocket 31.

Here, the "offset processing" is processing for adjusting the origin of the detection signal using a preset offset value. The sinusoidal detection signal outputted from magnetic sensor 42 does not have an average value of 0, and the sinusoidal detection signal may shift to the positive side or the negative side as a whole. Therefore, angle calculating section 432 performs the offset processing to offset the detection signal outputted from magnetic sensor 42 by the offset value, thereby adjusting the origin of the detection signal.

Note that, the offset value is set to an initial value after the feeder 20 is assembled, for example, when the feeder 20 is set in a dedicated calibration device. With the above-described calibration device, when sprocket 31 is rotated multiple times, sprocket 31 is stopped at every angle (for example, every one degree) corresponding to the resolution of angle sensor 40, and the detected signals outputted by the pair of magnetic sensors 42 are sampled. Then, the calibration device sets the offset value for each of the pair of magnetic sensors 42 based on the average value of the detected signals.

Specifically, the calibration device first calculates a difference ΔS between the average values (Av1, Av2) of the detected signals outputted from the pair of magnetic sensors 42 (ΔS=Av1−Av2). Then, for example, using the magnetic sensor 42 on one side as a reference (for example, offset value =0), the calibration device sets the difference ΔS to the offset value of the magnetic sensor 42 on the other side. In this manner, the offset value can be set so as to adjust one of the offset values with respect to the other such that the origins of the detection signals respectively outputted from the pair of magnetic sensors 42 coincide. In addition, the offset value may be set to a value such that both origins of the detected signals outputted from the pair of magnetic sensors 42 are zero.

The "gain processing" is processing for adjusting the magnitude of the detection signal using a gain value set in advance. The sinusoidal detected signal outputted from magnetic sensor 42 has a magnitude corresponding to the sensitivity of magnetic sensor 42, and the magnitude of the signal may differ depending on individual differences. Therefore, angle calculating section 432 adjusts the magnitude of the detection signal by increasing or decreasing the detection signal outputted from magnetic sensor 42 in accordance with the gain value by performing the gain processing.

Note that, the gain value is set to the initial value after the feeder 20 is assembled, for example, when the feeder 20 is set in a dedicated calibration device. With the above-described calibration device, when sprocket 31 is rotated multiple times, sprocket 31 is stopped at every angle (for example, every one degree) corresponding to the resolution of angle sensor 40, and the detected signals outputted by the pair of magnetic sensors 42 are sampled. Then, the calibration device sets a gain value for each of the pair of magnetic sensors 42 based on the largest value and the smallest value of the outputted detected signals.

Specifically, the calibration device first calculates the amplitudes (P1, P2) from the maximum values (Max1, Max2) and the minimum values (Min1, Min2) of the detected signals outputted by the pair of magnetic sensors 42 (P1=(Max1−Min1)/2, P2=(Max2−Min2)/2). Then, for example, using the magnetic sensor 42 on one side as a reference (for example, gain value=1), the calibration device sets the reciprocal (P2/P1) of the ratio of the amplitudes (P1, P2) to the gain value of the magnetic sensor 42 on the other side. In this manner, the gain value can be set so as to adjust one of the offset values with respect to the other such that the amplitudes of the detection signals respectively outputted from the pair of magnetic sensors 42 coincide. In addition, the gain value may be set to a value such that the amplitudes of the respective detected signals outputted from the pair of magnetic sensors 42 are both constant.

Angle calculating section 432 performs offset processing and gain processing on the detected signals respectively outputted by the pair of magnetic sensors 42. However, as described above, when the offset value (=0) and the gain value (=1) are set with respect to one of the pair of magnetic sensors 42, the offset processing and the gain processing can be practically omitted with respect to the detection signal outputted the magnetic sensor 42 as the reference.

In the above description, the average value, the maximum value, and the minimum value of the detection signal have been described as values of the detection signal itself. On the other hand, when it is known that the detection signal has a sinusoidal shape, an approximate curve having a sinusoidal shape may be calculated based on multiple sampled detection signals, and an average value, a maximum value, and a minimum value may be calculated from the approximate curve, and an origin or amplitude may be calculated from a function indicating the approximate curve.

Angle calculating section 432 calculates the angle of magnetic body 41 based on the adjusted detection signals. Specifically, angle calculating section 432 performs offset processing and gain processing on the detection signals outputted from the pair of magnetic sensors 42, respectively, and calculates angle α of magnetic body 41 based on the phase differences of the adjusted detection signals (X, Y) (α=arc tan (Y/X)). Sensor control section 43 outputs the calculated angle of magnetic body 41 as the current angle of sprocket 31.

Detection sensor 50 detects one of multiple engagement protrusions 311 of sprocket 31. In the present embodiment, detection sensor 50 includes light emitter 51 and light receiver 52. As shown in FIG. 4, light emitter 51 and light receiver 52 are disposed at diametrical positions of sprocket 31 on which engagement protrusion 311 is formed so as to oppose each other so as to sandwich the engagement protrusion 311. Detection sensor 50 receives the light emitted from light emitter 51 via light receiver 52. When switching to a state in which light is blocked from entering light receiver 52, detection sensor 50 recognizes that one of the multiple protrusions 311 is positioned between light emitter 51 and light receiver 52.

Control device 60 rotates sprocket 31 to control the conveyance of tape 80. When feeder 20 is set in an upper section slot 12 of component mounting machine 10, electric power is supplied from component mounting machine 10 via connector 212. As a result, control device 60 can communicate with component mounting machine 10. Control device 60 controls operation of driving device 30 based on a control command or the like by component mounting machine 10.

Specifically, control device 60 supplies pulse power to stepping motor 32 of driving device 30, and performs control to position the multiple cavities 81 of tape 80 sequentially at supply section 211. As tape 80 is pitch-fed by the operation of driving device 30, cover tape 83 is peeled off before supply section 211. In this manner, feeder 20 supplies components to supply section 211 for pickup at component mounting machine 10.

1-3. Angle Sensor 40 Maintenance Processing

Control device 60 of feeder 20 has a function of correcting the offset value and the gain value initialized as calibration values of angle sensor 40. Control device 60 performs maintenance processing of appropriately correcting the offset value and the gain value based on the detected signals respectively outputted from the pair of magnetic sensors 42, for example, with respect to the operating condition of feeders 20 being used in mounting process by component mounting machine 10.

Referring to FIGS. 3 and 7, maintenance processing of angle sensor 40 in the case of feeder 20 will be described. Here, it is assumed that feeder 20 loaded with tape 80 is set on an upper section slot 12 of component mounting machine 10. When feeder 20 is set in the upper section slot 12 and the power is turned on, control device 60 acquires the current angle of sprocket 31 using angle sensor 40. Control device 60 corrects the pulse power supplied to stepping motor 32 based on the acquired current angle of sprocket 31.

In an operating condition in which mounting processing is being performed by component mounting machine 10, for feeder device 20, control device 60 described above rotates sprocket 31 to sequentially position the multiple cavities 81 at supply section 211. Here, in tape 80 loaded in feeder 20, as shown in FIG. 3, it is assumed that interval T1 of cavities 81 is set to half interval T2 of engagement holes 82. In this case, feeder 20 supplies pulse power to stepping motor 32 so as to rotate sprocket 31 by half of the angle formed by adjacent engagement protrusions 311 in sprocket 31.

In the operation state described above, control device 60 acquires the current angle of sprocket 31 detected by angle sensor 40 in a state where sprocket 31 is stopped such that feeder 20 supplies a component to component mounting machine 10. Based on the current angle of sprocket 31, control device 60 determines, for example, whether the angle of sprocket 31 after rotation is appropriate, and determines as required whether deviation of stepping motor 32 has occurred.

Control device 60 acquires the angle of sprocket 31 using angle sensor 40 as described above, and stores the detected signals respectively outputted from the pair of magnetic sensors 42 used to calculate the angle in memory section 431. Memory section 431 stores new detection signals for a predetermined number of times from the current detection, for example, and deletes old detection signals exceeding a predetermined number of times. The above predetermined number of times is appropriately set to, for example, the number of times sprocket 31 stops while rotating one or multiple times.

More specifically, when the predetermined number of times is set as the number of times sprocket 31 stops while rotating once, assuming that tape 80 shown in FIG. 3 is loaded, stopping occurs twice the quantity of engagement protrusions 311 arranged on sprocket 31, and the detection signal is stored each time. That is, when 36 engagement projections 311 are arranged on sprocket 31, sprocket 31 stops every 5 degrees of rotation, and 72 detection signals (hereinafter referred to as "detection signals for one rotation") are stored during one rotation corresponding to the pair of magnetic sensors 42.

In the present embodiment, during mounting processing by component mounting machine 10, control device 60 performs maintenance processing of angle sensor 40, as shown in FIG. 7, every time the sprocket 31 rotates one turn, for example, each time the angle becomes an origin angle (the angle detected as 0 degrees by the angle sensor 40). First, control device 60 calculates offset values for each of the pair of magnetic sensors 42 based on detection signals for one revolution stored in memory section 431 for each of the pair of magnetic sensors 42 (Step 11 [hereinafter, step is referred to as "S"]). The offset value is calculated so as to adjust one of the pair of magnetic sensors 42 to a reference value (offset value=0) of the other, for example, similarly to the initialization.

Next, when the offset value calculated based on the detection signal outputted from the current magnetic sensor 42 is out of the allowable range with respect to the offset value used for the detection signal by angle calculating section 432 (S12: No), control device 60 performs correction processing for correcting the offset value (S13). Specifically, control device 60 stores the offset value on one side of the pair of magnetic sensors 42 as 0 and the offset value on the other side as the offset value calculated in S11 in memory section 431 of angle sensor 40. Note that, the allowable range is a range indicating whether the difference between the currently used offset value and the offset value calculated in S11 is allowable as an effect on the detection accuracy required for angle sensor 40.

When the offset value calculated in S11 is within the allowable range with respect to the currently used offset value (S12: Yes), or when the offset value correction processing (S13) is performed, control device 60 calculates the gain value for each of the pair of magnetic sensors 42 based on the detection signals for one rotation stored in memory section 431 for each of the pair of magnetic sensors 42 (S14). The gain value is calculated so as to adjust one of the pair of magnetic sensors 42 to a reference value (gain value=1) of the other, for example, similarly to the initialization.

Continuing, when the gain value calculated based on the detection signal outputted from the current magnetic sensor 42 is out of the allowable range with respect to the gain value used for the detection signal by angle calculating section 432 (S15: No), control device 60 performs correction processing for correcting the gain value (S16). Specifically, control device 60 stores the gain value on one side of the pair of magnetic sensors 42 as 1 and the gain value on the other side as the gain value calculated in S14 in memory section 431 of angle sensor 40. Note that, the allowable range is a range indicating whether the difference between the currently used gain value and the gain value calculated in S14 is allowable as an effect on the detection accuracy required for angle sensor 40.

When the gain value calculated in S14 is within the allowable range with respect to the currently used gain value (S15: Yes), or when the gain value correction processing (S16) is performed, control device 60 ends maintenance processing of angle sensor 40. Angle sensor 40 performs offset processing using the corrected offset value and gain processing using the corrected gain value in the next and subsequent angle detection, and outputs the current angle of sprocket 31 based on the detection signals adjusted by these. Control device 60 determines whether the angle of sprocket 31 is appropriate, for example, based on the current angle of sprocket 31 as described above.

2. Effects of Embodiments

According to the above-described feeder 20, control device 60 performs offset processing and gain processing on detection signals from magnetic sensors 42 to adjust the detection signals. As a result, feeder 20 can detect the angle of sprocket 31 in consideration of the individual difference of angle sensor 40 including magnetic sensors 42, the attachment tolerance, and the like. Therefore, the angle of sprocket 31 can be controlled more accurately by using the adjusted detection signals.

Further, since control device 60 can appropriately correct at least one of the offset value and the gain value used by angle sensor 40 for angle calculation, it is possible to cope with variations in the sensitivity of angle sensor 40 due to aging or the like. As a result, it is possible to prevent the detection accuracy of angle sensor 40 from deteriorating. Therefore, it is possible to maintain the positioning accuracy of components by feeder 20. Further, since maintenance of feeder 20 using an inspection device can be omitted for a long period of time, for example, the effect on the productivity of component mounting machine 10 using the feeder 20 can be reduced.

3. Alternative Embodiments

3-1. Correction Processing

In an embodiment, control device 60 performs correction processing by using the detection signals respectively outputted by the pair of magnetic sensors 42 at the angle at which sprocket 31 is stopped (the angle at which the sprocket 31 is stopped every five degrees) in order to feed components to component mounting machine 10 by feeder 20. On the other hand, when the offset value and the gain value are initialized, the calibration device stops sprocket 31 in accordance with the resolution of the angle sensor 40 and acquires the detection signals. For example, when the calibration device acquires detection signals by stopping sprocket 31 every time it rotates once, the calibration value is calculated based on the 360 detection signals that are outputted while sprocket 31 rotates once.

BRIEF SUMMARY

In other words, fewer detection signals are used in correction processing of the embodiment (72 times in the above configuration) than in initialization. On the other hand, control device 60 may use the same number of detection signals outputted for the initialization in correction processing, or may use a quantity of detection signals increased by a predetermined number of times in the correction processing, as illustrated in the embodiment.

Specifically, when correction processing is first performed, control device 60 determines the angle of sprocket 31 as one or multiple preset detecting angles. The detection angle may include an angle at which the deviation of the detection signal is maximum or minimum. Here, when magnetic body 41 is integrally provided on sprocket 31, since the position of the magnetic pole of magnetic body 41 is fixed with respect to the angle of sprocket 31, the angle at which deviations from the origin of the detected signals are maximized and minimized in relation to the mounting position of magnetic sensor 42 is known.

Specifically, as shown in FIG. 5, the detection angles above include 0°, 90°, 180°, and 270° if angle sensor 40 is constructed such that when the angle of the sprocket 31 is 0°, the deviation of one detection signal of the pair of magnetic sensors 42 is minimal (deviation=0) and the deviation of the other detected signal is maximal (deviation =Max). Further, control device 60 determines the angle of sprocket 31 to an angle including the detection angle, and uses the detection signals outputted from the pair of magnetic sensors 42 for correction processing.

Here, for example, when feeder 20 is loaded with tape 80 in which interval T1 of cavities 81 is twice or more than interval T2 of engagement holes 82, sprocket 31 is not necessarily positioned at the above-mentioned detection angle when feeder 20 is being operated. Therefore, when performing correction processing, when sprocket 31 reaches the detection angle during the pitch-feeding of tape 80, control device 60 temporarily stops sprocket 31 at the detection angle and samples the detection signals. According to the above-described configuration, the detection signals outputted at the detection angles remarkably closely indicate the characteristics of magnetic sensor 42, such that the accuracy of correction processing can be improved.

Note that, control device 60 may stop sprocket 31 at the detection angle only when it recognizes that correction processing is required such that temporarily stopping sprocket 31 at the detection angle does not affect production. That is, control device 60, for example, determines the necessity of correction processing based on the detection signals at the angles at which sprocket 31 is stopped while the feeder 20 is operation, as given in the example of the embodiment. Further, when it is determined that correction processing is required, control device 60 temporarily stops sprocket 31 at the detection angle during the subsequent period in which sprocket 31 rotates once. This minimizes the impact on production.

Various modes may be adopted for determining the necessity of correction processing. Specifically, when magnetic sensor 42 outputs a sinusoidal detection signal as in an example of an embodiment, control device 60 may determine to perform correction processing when, for example, at least one of the amplitudes of the detection signal adjusted by angle calculating section 432 or an intermediate value between a largest value and a smallest value of the detection signal is out of an allowable range.

That is, control device 60 determines that correction processing is required when the magnitudes of the detected signals (maximum deviation from the origin) are excessive or insufficient despite the gain processing. Further, control device 60 determines that correction processing is required when the intermediate value between the maximum value and the minimum value of the detection signal (the minimum deviation with respect to the origin) is excessive or insufficient despite the offset processing.

Further, control device 60 may determine to perform correction processing when the angle of sprocket 31 calculated by angle calculating section 432 is out of the allowable range when sprocket 31 is at the specified angle. Here, feeder 20 may further include a supplementary sensor for detecting a condition in which sprocket 31 is at a specified angle with respect to feeder main body 21. As the supplementary sensor, for example, an origin sensor for detecting that sprocket 31 is at the origin is assumed.

That is, control device 60 determines that correction processing is required when the angle of sprocket 31 detected by angle sensor 40 includes an error equal to or greater than a predetermined value from the origin angle even though the origin sensor has detected that sprocket 31 is at the origin angle. In addition to the origin sensor, control device 60 may use the encoder of the servo motor as a supplementary sensor when detection sensor 50 given as an example in an embodiment or the drive source of feeder 20 is a servo motor. With such a configuration, detection signals of angle sensor 40 and the supplementary sensor can be used to prevent deterioration of the detection accuracy of the respective sensor.

Further, control device 60 may determine that correction processing is to be performed when at least one of the operating time of feeder 20 or the conveyed quantity of tape 80 exceeds a preset threshold, in addition to determining whether correction processing is necessary based on the detection signals and the calculated angles as described above. According to such a configuration, control device 60 performs correction processing, for example, periodically regardless of the current sensitivity of angle sensor 40. As a result, the detection accuracy of angle sensor 40 can be suitably maintained.

Further, in the correction processing, control device 60 calculates the offset value and the gain value based on the detection signals for one revolution. On the other hand, control device 60 may calculate the offset value and the gain value based on the detection signals for multiple revolutions. In such a case, control device 60 may, among the detection signals for multiple revolutions, use the mean value or the median value as the detection signal for the angle for the value obtained when the sprocket 31 was the same angle, or may calculate approximate curves using these detection signals to perform similar processing.

Also, in an embodiment above, control device 60 performs maintenance processing of angle sensor 40 including correction processing in a state in which feeder 20 is being used for mounting processing by component mounting machine 10. On the other hand, control device 60 may perform maintenance processing at any time as long as power can be supplied to the feeder 20. For example, control device 60 may perform maintenance processing while component mounting machine 10 is in a standby state, or while feeder 20 is held in a storage compartment or preparation cart capable of supplying power to the feeder 20.

When maintenance processing is performed in the above-described state with feeder 20 loaded with tape 80, the tape 80 is conveyed as sprocket 31 rotates. In order to prevent wasting components due to this, control device 60 first rotates sprocket 31 one turn in a direction opposite to the operating state when performing maintenance processing. Next, control device 60 rotates sprocket 31 forward at specified angular intervals to obtain detection signals. According to such a configuration, it is possible to prevent wasting components due to maintenance processing.

3-2. About Angle Sensor 40

In an embodiment above, angle sensor 40 is composed of magnetic body 41 and pair of magnetic sensors 42. However, angle sensor 40 may adopt various modes as long as the angle of sprocket 31 can be detected using magnetic body 41 and one or more magnetic sensors 42. Specifically, the number of magnetic poles of magnet member 41 may be larger than two, or the pair of magnetic sensors 42 may be arranged apart from each other by any angle as long as the phases of the detection signals are shifted from each other.

Further, in an embodiment above, since magnetic body 41 is provided on sprocket 31, angle calculating section 432 is configured to directly calculate the angle of sprocket 31. However, angle calculating section 432 may be configured to indirectly calculate the angle of sprocket 31. For example, angle calculating section 432 may be provided with magnetic body 41 of angle sensor 40 so as to detect the angle of intermediate gear 34, which is another gear that rotates in conjunction with the rotation of sprocket 31, and calculate the angle of sprocket 31 based on the angle of intermediate gear 34.

REFERENCE SIGNS LIST

10: electronic component mounting machine;
20: tape feeder;
21: feeder main body;
30: driving device;
31: sprocket;
32: stepping motor;
40: angle sensor;
41: magnetic body;
42: magnetic sensor;
43: sensor control section;
432: angle calculating section;
60: control device;
80: carrier tape;
90: circuit board;
T1, T2: interval

The invention claimed is:

1. A tape feeder for conveying carrier tape containing electronic components to supply the electronic components to an electronic component mounting machine, the tape feeder comprising:
   a feeder main body;
   a sprocket rotatably provided on the feeder main body and arranged with multiple engagement protrusions configured to engage with multiple engagement holes formed on the carrier tape;
   a magnetic body configured to rotate in conjunction with rotation of the sprocket;
   first and second magnetic sensors arranged at a predetermined angle from each other in a rotational direction of the magnetic body, each of the first and second magnetic sensors being configured to output a detection signal corresponding to an angle of the magnetic body with respect to the feeder main body;
   an angle calculating section configured to perform offset processing for adjusting an origin of the detection signal using a preset offset value, gain processing for adjusting a magnitude of the detection signal using a preset gain value, and calculation of an angle of the magnetic body based on the adjusted detection signal; and
   a control device configured to control rotation of the sprocket based on an angle of the magnet body calculated by the angle calculating section,
   wherein the control device is configured to perform correction processing for correcting the offset value and the gain value based on the detection signals outputted from the first and second magnetic sensors,
   wherein the angle calculating section is configured to perform offset processing using the offset value set in advance for each of the first and second magnetic sensors, and gain processing using the gain value set in advance for each of the first and second magnetic sensors, and calculate an angle of the magnetic body based on a phase difference of each adjusted detection signal,
   wherein the control device is configured to correct the offset value by setting the offset value of the first magnetic sensor to 0 and setting the offset value of the second magnetic sensor to a difference between the offset values between the first and second magnetic sensors based on the detection signal output from the first and second magnetic sensors, and
   wherein the control device is configured to correct the gain value by setting the gain value of the first magnetic sensor to 1 and setting the gain value of the second magnetic sensor to a ratio between the gain value of the second magnetic sensor to the gain value of the first magnetic sensor based on the detection signal output from the first and second magnetic sensors.

2. The tape feeder according to claim 1, wherein the control device is configured to perform the correction processing based on the detection signals outputted from the magnetic sensor while the sprocket is stopped so as to provide the electronic component to the electronic component mounting machine.

3. The tape feeder according to claim 1, wherein the control device is configured to perform the correction processing for correcting the offset value when the offset value calculated based on the detection signal outputted from the magnetic sensor is out of an allowable range with respect to the offset value used by the angle calculating section for adjusting the detection signal.

4. The tape feeder according to claim 1, wherein
the control device is configured to perform the correction processing for correcting the gain value when the gain value calculated based on the detection signal outputted from the magnetic sensor is out of an allowable range with respect to the gain value used by the angle calculating section for adjusting the detection signal.

5. The tape feeder according to claim 1, wherein
the first and second magnetic sensors are configured to output a sinusoidal detection signal, and
the control device is configured to perform the correction processing when at least one of the amplitudes of the detection signal adjusted by the angle calculating section or an intermediate value between a largest value and a smallest value of the detection signal is out of an allowable range.

6. The tape feeder according to claim 1, further comprising:
an assisting sensor configured to detect a state in which the sprocket is at a defined angle with respect to the feeder main body, and wherein
the control device is configured to perform the correction processing when the angle of the sprocket calculated by the angle calculating section is out of an allowable range when the sprocket is at the defined angle.

7. The tape feeder according to claim 1, wherein
the control device is configured to perform the correction processing when at least one of an operating time of the tape feeder or a conveyance quantity of the carrier tape exceeds a preset threshold.

8. The tape feeder according to claim 1, wherein
the control device is configured to, when performing the correction processing, make the sprocket be angled to one or multiple preset detection angles, wherein the detection signal used for the correction processing includes a detection signal outputted from the magnetic sensor when the angle to which the sprocket was made was the detection angle.

9. The tape feeder according to claim 8, wherein
the first and second magnetic sensors are configured to output a sinusoidal detection signal, and the one or multiple detection angles include an angle at which a deviation of the detection signal is maximized or minimized.

10. The tape feeder according to claim 1, wherein
the magnetic body is provided on the sprocket and the angle calculating section is configured to directly calculate an angle of the sprocket with respect to the feeder main body.

* * * * *